US011951660B2

(12) United States Patent
Shackleton et al.

(10) Patent No.: US 11,951,660 B2
(45) Date of Patent: Apr. 9, 2024

(54) SHAPING SYSTEM INCLUDING AN EVAPORATION COVER, SHAPING PROCESS, AND METHOD OF MANUFACTURING AN ARTICLE

(71) Applicant: CANON KABUSHIKI KAISHA, Tokyo (JP)

(72) Inventors: Steven C. Shackleton, Austin, TX (US); Alireza Aghili, Austin, TX (US); Zhengmao Ye, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/498,568

(22) Filed: Oct. 11, 2021

(65) Prior Publication Data

US 2023/0109973 A1 Apr. 13, 2023

(51) Int. Cl.
*B29C 43/32* (2006.01)
*B29C 43/02* (2006.01)
*B29C 43/10* (2006.01)
*B29C 43/18* (2006.01)
*B29C 43/20* (2006.01)
*B29C 43/34* (2006.01)

(52) U.S. Cl.
CPC ............ *B29C 43/10* (2013.01); *B29C 43/021* (2013.01); *B29C 43/18* (2013.01); *B29C 43/203* (2013.01); *B29C 43/34* (2013.01); *B29C 2043/3216* (2013.01); *B29C 2043/3433* (2013.01)

(58) Field of Classification Search
CPC ........ G03F 7/00; G03F 7/0002; G03F 7/0015; G03F 7/0037; G03F 7/12; G03F 7/26; B29C 43/32; B29C 51/00; B29C 51/26
See application file for complete search history.

(56) References Cited

U.S. PATENT DOCUMENTS

| | | | |
|---|---|---|---|
| 4,751,029 A * | 6/1988 | Swanson ............... | B29C 31/044 |
| | | | 425/451.2 |
| 8,257,498 B2 | 9/2012 | Yamawaku et al. | |
| 8,936,507 B2 * | 1/2015 | Sato .................. | H01L 21/67766 |
| | | | 414/217 |
| 2014/0234467 A1 * | 8/2014 | Sato ....................... | B82Y 40/00 |
| | | | 425/385 |
| 2020/0339828 A1 | 10/2020 | Li et al. | |

FOREIGN PATENT DOCUMENTS

| | | |
|---|---|---|
| JP | 2002-83854 A | 3/2002 |
| JP | 2003-092335 A | 3/2003 |
| JP | 2003-142552 A | 5/2003 |

* cited by examiner

*Primary Examiner* — Thu Khanh T. Nguyen
(74) *Attorney, Agent, or Firm* — CANON U.S.A., INC. IP Division (57) ABSTRACT

A shaping system comprises a dispensing station configured to dispense formable material on a substrate, a shaping station configured to contact the dispensed formable material on the substrate with a plate, a positioning system configured to move the substrate having the dispensed formable material from the dispensing system to the shaping station, and a cover having one or more walls. While the substrate having the dispensed formable material is moved by the positioning system from the dispensing station to the shaping station, the cover is positioned to enclose the substrate and the dispensed formable material such that a ratio of a diameter of the substrate to a distance between the cover and the substrate to 80:1 to 30:1.

24 Claims, 9 Drawing Sheets

SHAPING SYSTEM INCLUDING AN EVAPORATION COVER, SHAPING PROCESS, AND METHOD OF MANUFACTURING AN ARTICLE

BACKGROUND

Field of Art

The present disclosure relates to substrate processing, and more particularly, to planarization or imprinting of surfaces in semiconductor fabrication.

Description of the Related Art

Planarization and imprinting techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization reduces the impact of depth of focus (DOF) limitations, and improves critical dimension (CD), and critical dimension uniformity. In extreme ultraviolet lithography (EUV), planarization improves feature placement and reduces the impact of DOF limitations. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

One step in a planarization/imprint method includes moving a substrate from a formable material dispensing station to a planarizing/imprinting station after the formable material has been dispensed on the substrate. During the moving from the dispensing station to the planarization/imprint station, the formable material may evaporate. This evaporation leads to an undesirable amount deviation from a target residual layer thickness (RLT). Thus, there is a need for a planarization/imprint system and method that reduces and/or eliminates evaporation of formable material when moving the substrate from a dispensing station to a planarizing/imprinting station.

SUMMARY

In an embodiment, a shaping system comprises a dispensing station configured to dispense formable material on a substrate, a shaping station configured to contact the dispensed formable material on the substrate with a plate, a positioning system configured to move the substrate having the dispensed formable material from the dispensing system to the shaping station, and a cover having one or more walls. While the substrate having the dispensed formable material is moved by the positioning system from the dispensing station to the shaping station, the cover is positioned to enclose the substrate and the dispensed formable material such that a ratio of a diameter of the substrate to a distance between the cover and the substrate to 80:1 to 30:1.

In another embodiment, a shaping system comprises a dispensing station configured to dispense formable material on a substrate, a shaping station configured to contact the dispensed formable material on the substrate with a plate, a positioning system configured to move the substrate having the dispensed formable material from the dispensing system to the shaping station, a cover positioned to enclose the substrate and the dispensed formable material while the substrate having the dispensed formable material is being moved by the positioning system from the dispensing system to the shaping station, and a porous pad disposed inside the cover while the cover encloses the substrate and the dispensed formable material.

In an embodiment, a method of shaping comprises dispensing formable material on a substrate at a first location, moving the substrate having the dispensed formable material from the first location to a second location, and contacting the dispensed formable material on the substrate with a plate at the second location to form a film layer. While the substrate having the dispensed formable material is moved from the first location to the second location, a cover having one or more walls is positioned to enclose the substrate and the dispensed formable material such that a ratio of a diameter of the substrate to a distance between the cover and the substrate to 80:1 to 30:1.

In an embodiment, a method of manufacturing an article comprises dispensing formable material on a substrate at a first location, moving the substrate having the dispensed formable material from the first location to a second location, contacting the dispensed formable material on the substrate with a plate at the second location to form a film layer, curing the film layer to form a cured film layer, and processing the cured film layer to make the article. While the substrate having the dispensed formable material is moved from the first location to the second location, a cover having one or more walls is positioned to enclose the substrate and the dispensed formable material such that a ratio of a diameter of the substrate to a distance between the cover and the substrate to 80:1 to 30:1.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
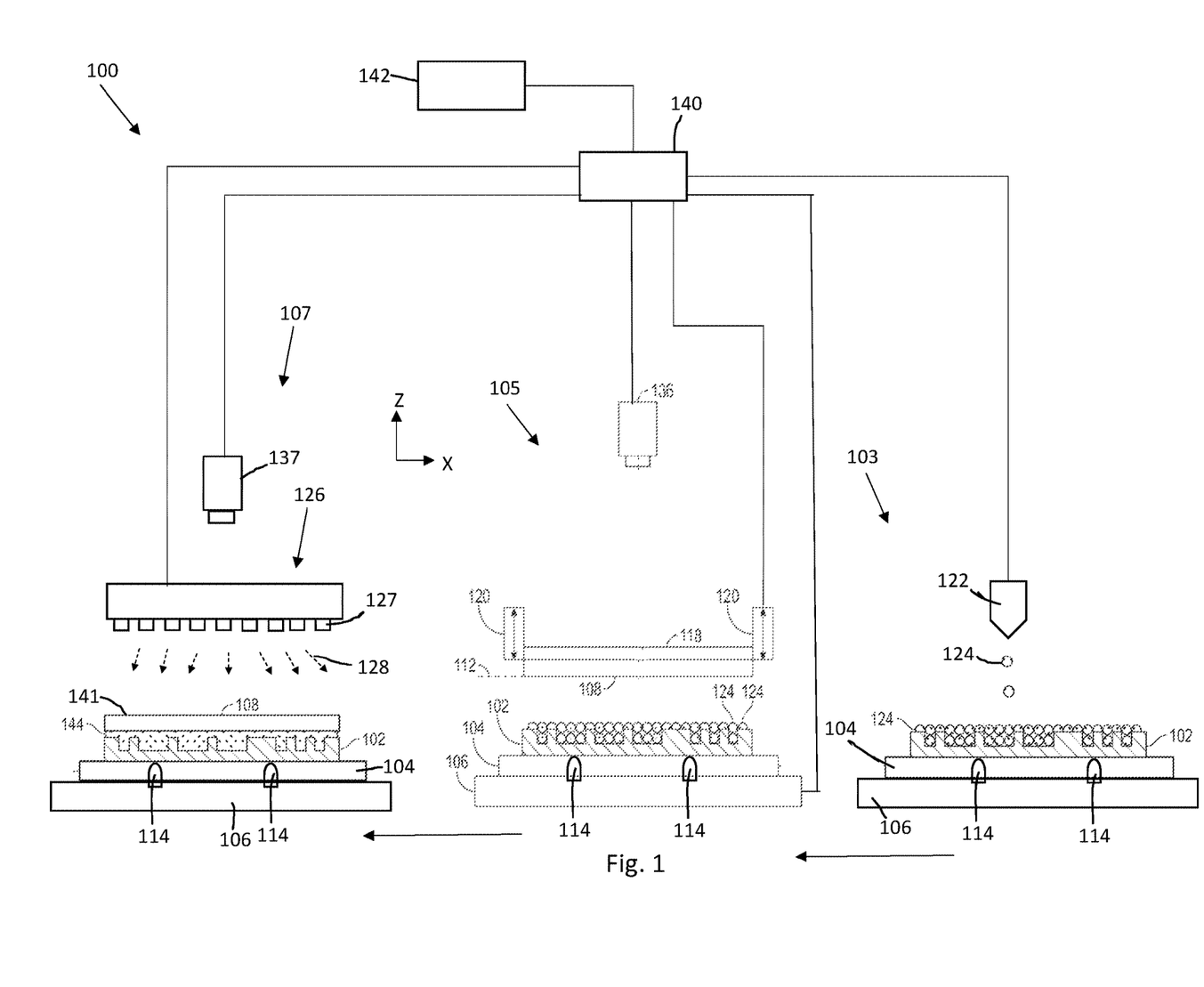
FIG. 1 is a schematic diagram illustrating an example planarization system in accordance with an aspect of the present disclosure.

FIG. 1 illustrates an example system for shaping a surface in accordance with an aspect of the present disclosure. The system for shaping a surface may be, for example, a planarization system or an imprint system. The example embodiment described herein is a planarization system 100. However, the concepts are also applicable to an imprint system. Thus, while the terminology throughout this disclosure is primarily focused on planarization, it should be understood that the disclosure is also applicable to the corresponding terminology of an imprint context.

The shaping system, e.g., the planarization system 100, is used to planarize a film on a substrate 102. In the case of the shaping system being a imprint system, the imprint system is used to form a pattern on the film on the substrate. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be supported by a substrate positioning stage 106. The substrate positioning stage 106 may provide translational and/or rotational motion along one or more of the x-, y-, z-, θ-, ψ, and φ-axes. The substrate positioning stage 106, the substrate 102, and the substrate chuck 104 may also be positioned on a base (not shown). Separate from the stage 106, a positioning system 110, 150, discussed below with respect to FIGS. 2A and 2B, may be used to provide the translational and/or rotational motion.

As shown in FIG. 1, in an example embodiment, the planarization system 100 may include three separate stations: a dispensing station 103, a shaping station (e.g., a planarizing station 105), and a curing station 107. The three stations may be located at different locations. A positioning system 110, 150 may be capable transferring the substrate 102 to each of the three stations. In some instances, a stage 106 may participate in the movement of the substrate 102. In the example embodiments discussed below in more detail with respect to FIGS. 4A to 4N, the planarizing station 105 is located at a first location and the dispensing station 103 is located at a second location that is different from the first location. In these example embodiments the substrate 102 is carried from the dispensing station 103 to the planarizing station 105 using the positioning system 110 of FIG. 2A or the positioning system 150 of FIG. 2B. As discussed in more detail below, each of the stations may include a lift mechanism 114 that is configured to lift the substrate 102 from the substrate chuck 104 as part of the transferring process. In one example embodiment the lift mechanism 114 is a pin lift. More particularly, as shown in FIG. 1, each of the dispensing station 103, the planarization station 105, and the curing station 107, may include a separate lift mechanism 114, as well as a separate substrate chuck 104 and a separate positioning stage 106. That is, the same reference number is used to designate the lift mechanism 114, the substrate chuck 104, and the positioning stage 106 in all of the stations because the structure of the lift mechanism 114, substrate chuck 104, and positioning stage 106 is identical at each station. However, it should be understood that each station has its own lift mechanism 114, substrate chuck 104, and positing stage 106.

The dispensing station 103 of the planarization system 100 may comprise a fluid dispenser 122. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. The formable material may be a photocurable composition comprising a photoinitiator and monomers. Exemplar monomers which may be in the photocurable composition include: acrylate monomers; vinyl monomers; styrenic monomers; etc. The formable material may have the composition described in U.S. Pat. App. Pub. No. 2020/0339828, which is hereby expressly incorporated by reference herein. As discussed in U.S. Pat. App. Pub. No. 2020/0339828, the formable material may be a photocurable composition comprising a polymerizable material and a photoinitiator, wherein at least 90 wt % of the polymerizable material may comprise acrylate monomers including an aromatic group. The photocurable composition can have a viscosity of not greater than 10, 15, 20, or 30 mPa·s, the total carbon content of the photocurable composition after curing can be at least 73%, and the Ohnishi number may be not greater than 3.0. At least 90 wt % of the polymerizable material can include monomers containing an aromatic group in their chemical structure. Some non-limiting examples of monomers comprising an aromatic group can be: benzyl acrylate (BA), benzyl methacrylate (BMA), 1-naphthyl methacrylate (1-NMA), bisphenol A dimethacrylate (BPADMA), 1-naphthyl acrylate (1-NA), 2-naphthyl acrylate (2-NA), 9,9-bis[4-(2-acryloyloxy ethoxy) phenyl]fluorine (A-BPEF), 9-fluorene methacrylate (9-FMA), 9-fluorene acrylate (9-FA), o-phenylbenzyl acrylate (o-PBA), bisphenol A diacrylate (BPADA), propenoic acid, 1,1'-[1,1'-binaphthalene]-2,2'-diyl ester (BNDA), styrene, divinyl benzene (DVB). Further details of the composition may be found in U.S. Pat. App. Pub. No. 2020/0339828. Some non-limiting examples of suitable monofunctional (meth)acrylates to be included in the polymerizable material are: isobornyl acrylate; 3,3,5-trimethylcyclohexyl acrylate; dicyclopentenyl acrylate; dicyclopentenyl acrylate; dicyclopentenyl oxyethyl acrylate; benzyl acrylate; naphthyl acrylate; 2-phenylethyl acrylate; 2-phenoxyethyl acrylate; phenyl acrylate; (2-ethyl-2-methyl-1,3-dioxolan-4-yl)methyl acrylate; o-phenyl benzyl acrylate; butyl acrylate; ethyl acrylate; methyl acrylate; n-hexyl acrylate; 2-ethyl hexyl acrylate; 4-tert-butylcyclohexyl acrylate; methoxy polyethylene glycol (350) monoacrylate; 2-methoxyethyl acrylate; lauryl acrylate; stearyl acrylate; 9-fluorene acrylate. Some non-limiting examples of suitable diacrylates to be included in the polymerizable material are: ethylene glycol diacrylate; diethylene glycol diacrylate; triethylene glycol diacrylate; tetraethylene glycol diacrylate; 1,2-propanediol diacrylate; dipropylene glycol diacrylate; tripropylene glycol diacrylate; polypropylene glycol diacrylate; 1,3-propanediol diacrylate; 1,4-butanediol diacrylate; 2-butene-1,4-diacrylate; 1,3-butylene glycol diacrylate; 3-methyl-1,3-butanediol diacrylate; 1,5-pentanediol diacrylate; 3-Methyl-1,5-pentanediol diacrylate; neopentyl glycol diacrylate; tricyclodecane dimethanol diacrylate; 1,6-hexanediol diacrylate; 1,9-nonanediol diacrylate; 1,10-decanediol diacrylate; 1,12-dodecanediol diacrylate; cyclohexane dimethanol diacrylate; bisphenol A diacrylate; ethoxylated bisphenol A diacrylate; m-xylylene diacrylate; 9,9-bis[4-(2-acryloyloxy ethoxy) phenyl]fluorine; 2,2'-diacrylate-1,1'-binaphthalene; dicyclopentanyl diacrylate; 1,2-adamantanediol diacrylate; 2,4-diethylpentane-1,5-diol diacrylate; poly(ethylene glycol) diacrylate; 1,6-hexanediol (EO)2 diacrylate; 1,6-hexanediol (EO)5 diacrylate; and alkoxylated aliphatic diacrylate esters. Some non-limiting examples of suitable multifunctional acrylates to be included in the polymerizable material are: trimethylolpropane triacrylate; propoxylated trimethylolpropane triacrylate (e.g., propoxylated (3) trimethylolpropane triacrylate, propoxylated (6) trimethylolpropane triacrylate); trimethylolpropane ethoxylate triacrylate (e.g., n~1.3,3,5); di(trimethylolpropane) tetraacrylate; propoxylated glyceryl triacrylate (e.g., propoxylated (3) glyceryl triacrylate); 1,3,5-adamantanetriol triacrylate; tris (2-hydroxy ethyl) isocyanurate triacrylate; pentaerythritol triacrylate; Trisphenol PA triacrylate; pentaerythritol tetracrylate; ethoxylated pentaerythritol tetracrylate; dipentaerythritol pentaacrylate; tripentaerythritol octaacrylate; trimethylolpropane(PO)n triacrylate (n is 1, 2, 3 . . . ); trimethylolpropane(EO)n triacrylate (n is 1, 2, 3 . . . ). Examples of the vinyl benzene type of monomers include vinylbenzene (styrene), divinylbenzene (DVB), trivinylbenzene (TVB), 3,3'-divinylbiphenyl, 3,4',3-trivinylbiphenyl, 3,3',5,5'-tetravinylbiphenyl, 1,2-bis(3-vinylphenyl)ethane, bis(4-vinylphenyl) ether, bis(3-vinylphenyl) ether. Some non-limiting examples of suitable multifunctional monomers to be included in the polymerizable material are: molecules containing both acrylate functional groups and vinyl groups directly connected to aromatic rings. For example, 3-vinyl benzyl acrylate, 2-(4-vinyl)-phenyl, 1,3-propane diacrylate, 3,5-bivinyl benzyl acrylate, and 5-vinyl, 1,3-xylene diacrylate. Some non-limiting examples of maleimides and bismaleimides to be included in the polymerizable material are: N-benzylmaleimide; N-cyclohexylmaleimide; N-phenylmaleimide; and bis(3-ethyl-5-methyl-4-maleimidophenyl)methane. Some non-limiting examples of suitable benzoxazines to be included in the polymerizable material are: 6,6'-Methylenebis[3,4-dihydro-3-phenyl-2H-1,3-benzoxazine; and 3,3'-(Methylenedi-4,1-phenylene)bis[3,4-dihydro-2H-1,3-benzoxazine.

Different fluid dispensers 122 may use different technologies to dispense the formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids. Because the substrate 102 is brought to the dispensing station 103, and because the dispensing station 103 is a different location than the planarizing station 105, the fluid dispensers 122 may be stationary. In another embodiment the fluid dispensers 122 may movable.

As shown in FIG. 1, the planarizing station 105 of the planarization system 100 may comprise a plate, e.g., a superstrate 108, having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is readily transparent to UV light radiation. The surface 112 is generally of the same areal size as or slightly larger than the surface of the substrate 102. In the case of the shaping station being an imprinting station, the plate may be a template with a patterned surface.

The planarizing station 105 may further include a plate chuck, e.g., a superstrate chuck 118, and a planarization head 120. The superstrate 108 may be coupled to or retained by the superstrate chuck 118. The superstrate chuck 118 may be coupled to the planarization head 120. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g., x-, y-, θ-, ψ-, and φ-axis). In operation, either the planarization head 120, the substrate positioning stage 106, or both vary a distance between the superstrate 108 and the substrate 102 to define a desired space (a bounded physical extent in three dimensions) that is filled with the formable material 124. For example, the planarization head 120 may be moved toward the substrate and may apply a force to the superstrate 108 such that the superstrate contacts and spreads droplets of the formable material 124 as further detailed herein. In the case the shaping station being an imprinting station, the plate chuck is a template chuck.

The planarizing station 105 may further comprise a camera 136 positioned to view the spread of formable material 124 as the superstrate 108 contacts the formable material 124 during the planarizing process. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the surface 112 and the substrate surface.

As noted above, the curing station 107 may be located at a different location than the planarizing station 105. In another embodiment the curing may be implemented at the planarizing station 105 such that there is not a separate curing station. In the case of there being a separate curing station 107, following the forming of the formable material film 144 at the planarizing station 105, the substrate 102 having a formable material film 144 and the superstrate 108 thereon, will travel to the curing station 107. The curing station 107 includes a radiation source 126 that directs actinic energy, for example, UV light radiation, along an exposure path 128. In an example embodiment the radiation source 126 comprises an array of light emitting diodes (LEDs) 127. The array of LEDs 127 may be configured such that the emitted light is distributed at 80% or greater uniformity across the substrate 102. The wavelength of the light emitted may be 300 to 400 nm. The substrate 102 and the superstrate 108, with the formable material film 144 in between, may be positioned in superimposition with the exposure path 128. The array of LEDs 127 transmits the actinic energy along the exposure path 128. In this manner, the actinic energy is uniformly applied to the formable material film 144. In the example embodiment where the curing occurs at the curing station 107, the system does not include (is free from) additional optical components (e.g., dichroic mirrors, beam combiners, prisms, lenses, mirrors, etc.). However, in an embodiment where the curing is implemented at the same location as the planarizing station, such optical components may be included to direct the energy to the formable material. The curing station 107 may further include a separate camera 137 for data collection and monitoring with respect to the curing process. In an embodiment where the curing features are implemented at the same location as the planarizing station, the camera 136 may be used to monitor curing.

The planarization system 100 may be regulated, controlled, and/or directed by one or more processors 140 (controller) in communication with one or more components and/or subsystems such as the substrate chuck 104, the substrate positioning stage 106, the positioning system 110, 150, the superstrate chuck 118, the fluid dispenser 122, the planarization head 120, the camera 136, the radiation source 126, and/or the camera 137. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140.

Figure 2A:
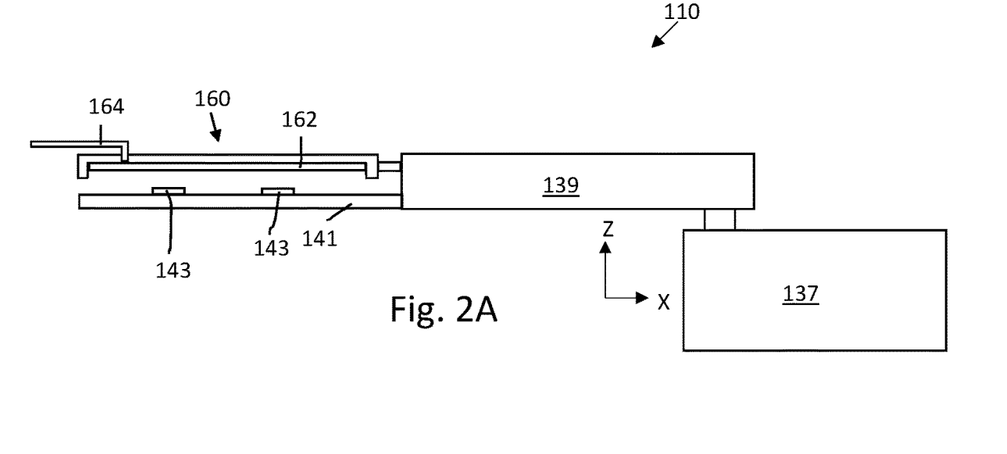
FIG. 2A illustrates a schematic cross section of an example positioning system in accordance with an aspect of the present disclosure.
Figure 2B:
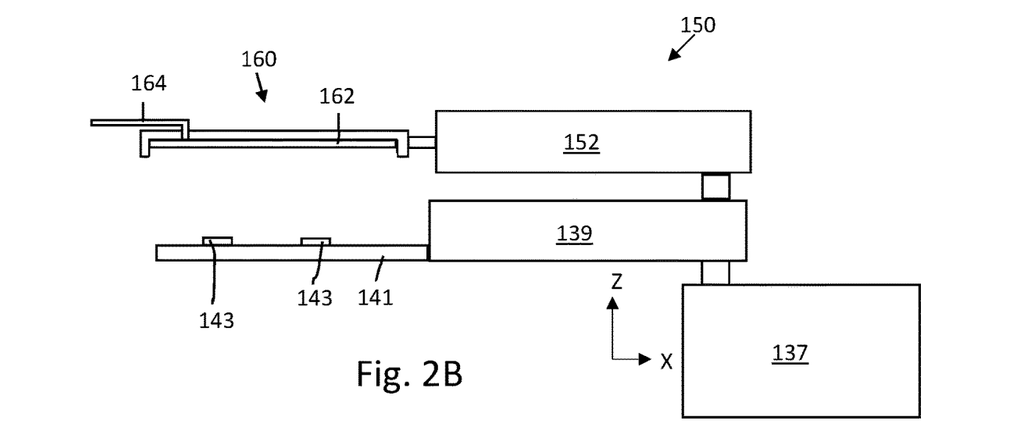
FIG. 2B illustrates a schematic cross section of another example positioning system in accordance with another aspect of the present disclosure.
Figure 2C:
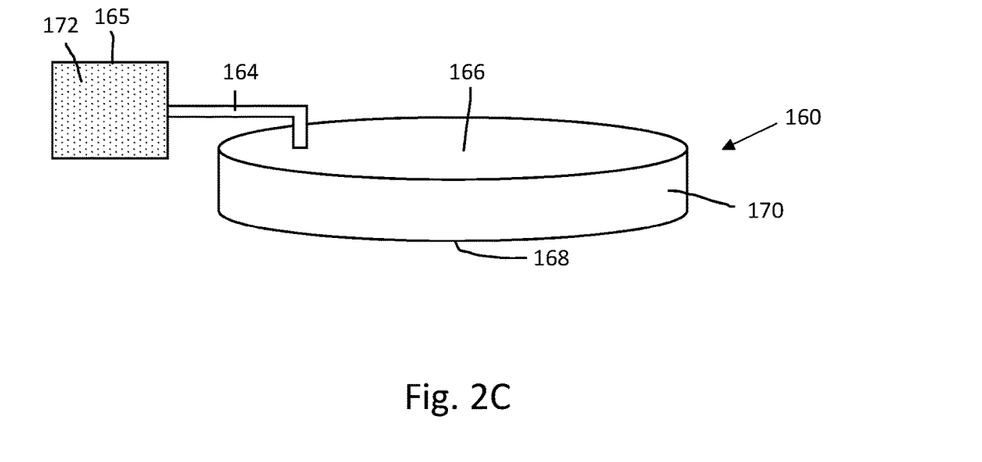
FIG. 2C illustrates a schematic perspective view of an example cover in accordance with an aspect of the present disclosure.

FIG. 2A shows a schematic cross section of a positioning system 110 in accordance with an example embodiment. FIG. 2B shows a schematic cross section of a positioning system 150 in accordance with another example embodiment. FIG. 2C shows a schematic perspective view of a cover 160 coupled with the positioning systems 110, 150.

As shown in FIG. 2A the positioning system 110 includes a first articulating arm 137 coupled with a second articulating arm 139. The positioning system 110 further includes a hand 141 coupled with the second articulating arm 139. The hand 141 is also known as an end effector. The hand 141 is configured to carry and place the substrate 102 onto the substrate stage 106 at the various stations during the planarization process. The hand 141 may include one or more support pads 143 for coming into contact with the underside of the substrate 102. In an embodiment, the support pads 143 may be connected to a vacuum source to provide a suction to actively hold the substrate 102 on the support pads 143. In an alternative embodiment, the support pads 143 are not connected a vacuum source and the substrate 102 is passively held on the hand 141 by gravity. As shown in FIG. 2A a cover 160 is coupled with the articulating arm 139. The cover 160 is discussed in more detail below with respect to FIG. 2C. The cover 160 may be made out of material that blocks actinic radiation which would induce polymerization in the liquid formable material 124 and may be transparent to some bandwidth of visible light which does not induce polymerization in the liquid formable material 124 (for example, a clear plastic with a film that blocks UV, violet, and blue light). The cover 160 may be made out of material that is non-reactive to the liquid formable material 124. For example, the cover 160 may be made of a metal, a plastic with a UV coating, a glass with a UV coating. Example materials that the cover may be made of include: aluminum; polyether ether ketone (PEEK); polyoxymethylene (also known as acetal); polytetrafluoroethylene (PTFE); a polyimide polymer (e.g., Vespel® manufactured by Dupont); alumina; or quartz.

A pad 162 may be provided within the cover 160. The pad 162 may be a porous pad. The pad 162 may be sintered or perforated, for example. The pad may have a volume fraction of at least 0.64. The pad is preferably open cell so that the voids create a network that can exchange with each other and the external environment. The pad may have void size of 0.03 microns to 100 microns. The pad may be made of metal such as stainless steel, titanium, nickel, ceramic such as alumina or silicon carbide, or a polymer material such as polyether ether ketone (PEEK), polyoxymethylene (also known as acetal), polytetrafluoroethylene (PTFE), or perfluoroalkoxy alkane (PFA). The sintered material may be coated with a material such as parylene to act as a barrier for metal ion transport or alter the wettability of the material. The pad 162 may have a generally circular shape similar in size to the substrate 102. The pad 162 may be mounted to an inside surface of the cover 160. The pad 162 may have a relatively large surface area while being relatively thin. The pad 162 may extend across substantially the entire inner diameter of the cover 160. Thus, the pad 162 may have a have a diameter that is just smaller than the inner diameter of the cover 160. That is, the diameter of the pad 162 may be as large as possible while still fitting within the cover 160. For the example, the inner diameter of the cover 160 may be 0.5% to 5% larger than the diameter of the pad 162.

A supply line 164 may be provided for supplying a fluid 172, i.e., a liquid to the pad 162. One end of the supply line 164 is contained within the cover 160 and terminating at the pad 162, while the other end of the supply line 164 is located outside of the cover 160 in communication with a fluid source 165. The fluid 172 can be provided by pump, by a differential pressure, or by syphon action due to the wicking of the porous pad. Preferably, the fluid is a liquid. The liquid is a more potent form than gas. With gas, there is a higher possibility of oversaturating the environment and inadvertently depositing material onto the substrate. In an example embodiment, when the fluid 172 is a liquid, the fluid 172 may be the formable material 124. That this, the fluid 172 being supplied to the pad 162 may be the formable material 124 that was dispensed onto the substrate 102. Accordingly, the composition of the fluid 172 may be the same as the composition of the formable material 124 described above. In another embodiment, the fluid may be a liquid having a different composition than the formable material 124. The formable material 124 may be a composition comprising: a photoinitiator; a surfactant; and a monomer. For example, the liquid composition may be the monomers that are in the formable material 124. The liquid composition may comprise those components of the formable material 124 that have a vapor pressure greater than a vapor pressure threshold. The vapor pressure threshold may be 0.133 Pascals (0.001 mmHg). For example, the composition may comprise: a first photoinitiator with a vapor pressure that is less than vapor pressure threshold; and a first monomer and a first surfactant both of which have a vapor pressure higher than the threshold, in which case the liquid composition is the first monomer and the first surfactant. For example, the composition may comprise: a second surfactant with a vapor pressure that is less than vapor pressure threshold; and a second monomer and a second photoinitiator both of which have a vapor pressure higher than the threshold, in which case the liquid composition is the second monomer and the second photoinitiator. In an embodiment, the formable material 124 may include solid components and liquid components. In which the solid components are solid when they are purely on their own and not in solution of the formable material 124. In which the liquid components are liquid when they are purely on their own and not in solution of the formable material 124. In an embodiment, the liquid composition include only the liquid components of the formable material 124 and does not include the solid components of the formable material 124. The solid components of the formable material wouldn't evaporate appreciably and would potentially build up over time on the porous pad 162.

In another embodiment, the fluid may be a gas. In the case that the fluid is a gas, the composition of the gas may be the volatile components of the formable material. When the fluid is gas, it is also possible to omit the porous pad entirely. The function of the porous pad to retain the fluid is not needed in the case of a gas. This is because the gas will the fill space above the substrate 102 to create the desired environment and does not need to be retained by a porous pad as a liquid would. The gas is a vapor produced by the liquid composition discussed above.

The positioning system 110 may translate and/or rotate along one or more of the x-, y-, z-axes; and three tilt axes as necessary via the first articulating arm 137 and the second articulating arm 139 to position the hand 141 and cover 160 to the desired location. That is, the positioning system 110, controlled via the controller 140, can pick up the substrate 102 with the hand 141 and position the substrate 102 the various stations, while also covering the substrate 102 with the cover 160, as is described in more detail below with respect to FIGS. 4A to 4N.

As shown in FIG. 2B the positioning system 150 similarly includes a first articulating arm 137 coupled with a second articulating arm 139. The positioning system 150 also similarly includes a hand 141 coupled with the second articulating arm 139 configured to carry and place the substrate 102 in the same manner as in the positioning system 110. The positioning system 150 further includes the same cover 160. The positioning system 150 differs from the positioning system 110 in that the positioning system 150 includes a third articulating arm 152. As shown in FIG. 2B, in the positioning system 150, the cover 160 is coupled with the third articulating arm 152. Because the cover 160 in the positioning system 150 is coupled to a separate articulating arm than the hand 141, the cover 160 can be moved and positioned independently from the hand 141. In the case of the positioning system 110, the cover 160 and the hand 141 are moved together because they are both coupled to the same articulating arm.

The cover 160 is the same in both positioning systems 110, 150. FIG. 2C shows a schematic perspective view the cover 160. As shown in FIG. 2C the cover 160 may include a generally cylindrical shape, i.e., having a circular cross section. The inside diameter of the cover 160 may be slightly larger than the diameter of the substrate 102. For the example, the inner diameter of the cover 160 may be 0.5% to 5% larger than the diameter of the substrate 102. The cover includes an enclosed top end 166, an open bottom end 168, and a wall 170 extending from the top end 166 to the bottom end 168, such that the cover 160 may enclose the substrate 102 when the substrate 102 passes into the cover 160 via the open bottom end 168 (i.e., the substrate is inside the cover). The wall 170 is a continuous circumferential wall in the illustrated example embodiment. The wall 170, along with the top end 166, define an inner volume of space V within the cover 160. As discussed below in more detail, as part of transferring the substrate 102 from the dispensing station (after dispensing) to the planarizing station 105, the substrate 102 can be inserted upwardly through the open bottom end 168 into the cover 160.

In another example embodiment, the cover may have a different shape other than cylindrical. For example, the cover may have a rectangular shape. In the case of the rectangular shape, the cover has a top end and four side walls. The rectangular shaped cover may have an open bottom end similar to the illustrated cover 160. The rectangular shaped cover may also have an open side end and a closed bottom end. In the case of an open bottom end, the substrate 102 can be inserted upwardly into the cover until the cover encloses the substrate 102 (i.e., the substrate is inside the cover) and in the case of the open side end, the substrate can be inserted laterally into the cover until the case encloses the substrate (i.e., the substrate is inside the cover), as noted below. In the case of a rectangular shaped cover, the pad within the cover may have a corresponding shape. That is, the pad may similarly have a rectangle shape with length and width dimensions that are within 0.5 to 5% of the inner length and width of the cover. The rectangular pad may have the same surface area to thickness ratio noted above in the circular embodiment.

In another example embodiment, the cover may be a hybrid shape including a cylindrical portion and a rectangular portion. For example, one half of the cover may have a cylindrical shape and one half may have a rectangular shape. In this case, the bottom end is enclosed and there is both a circumferential wall portion for one-half the length and opposing sidewalls for the over half of the length. The cover is open on one end on the rectangular shaped side. In this manner, the substrate 102 can be inserted laterally into the open rectangular shaped.

Planarization Method

Figure 3:
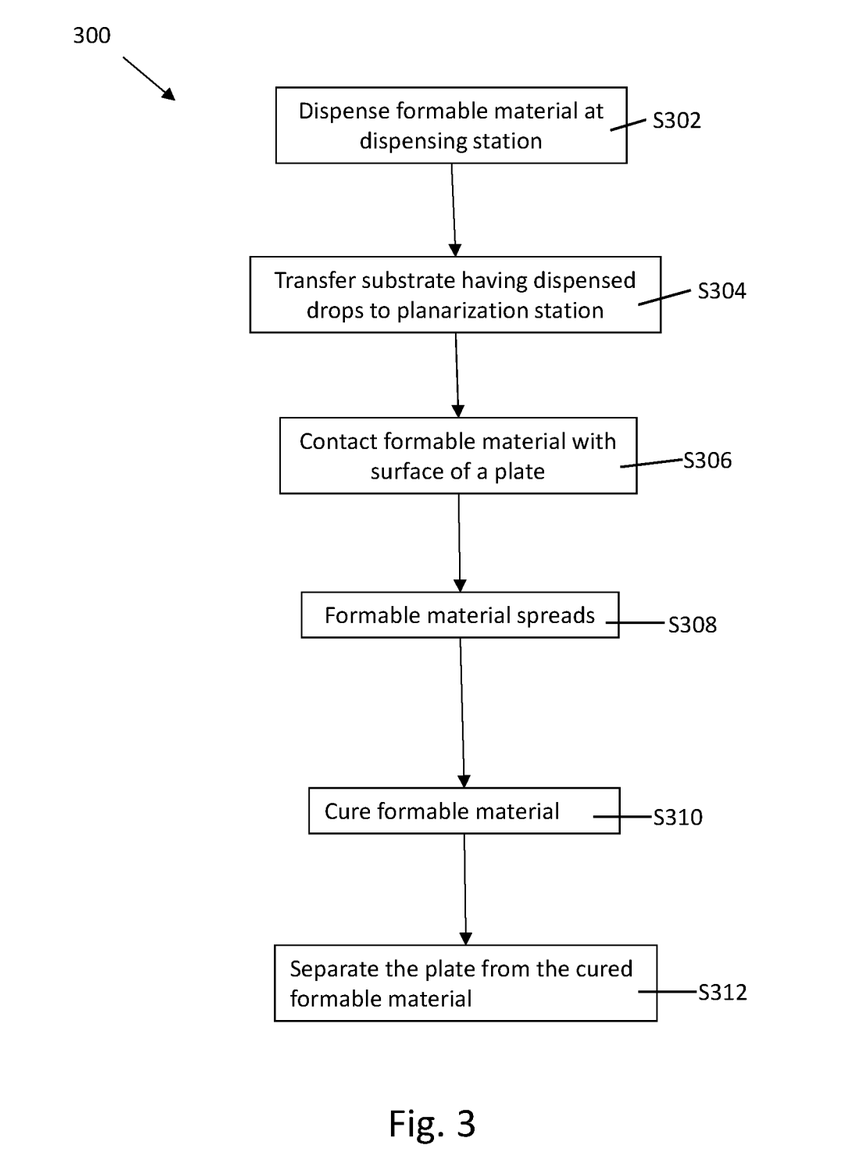
FIG. 3 shows a flow chart of an example planarization method in accordance with aspect of the present disclosure.
Figure 4A:
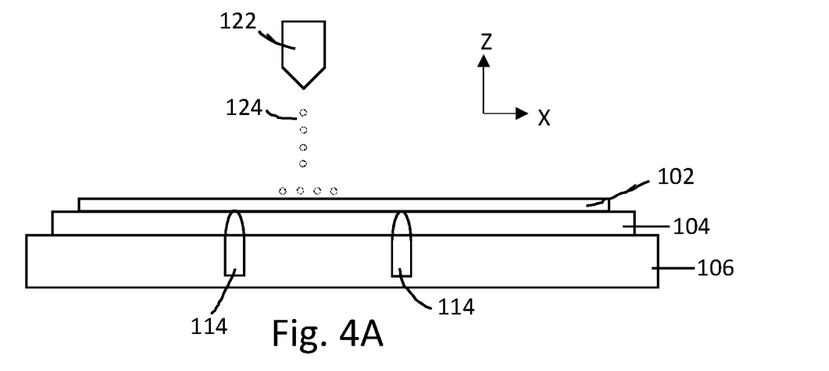
FIGS. 4A to 4N show a series of schematic cross sections of a portion of the planarization method of FIG. 3 including the steps of transferring a substrate having dispensed drops from a dispensing station to a planarization station.
Figure 4B:
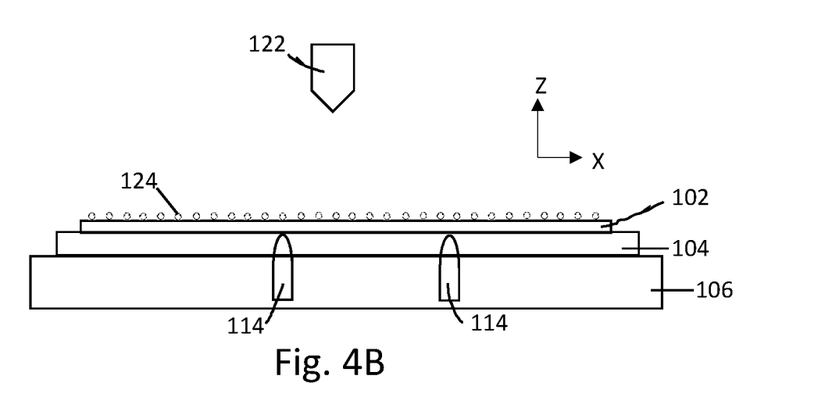
Figure 4N:
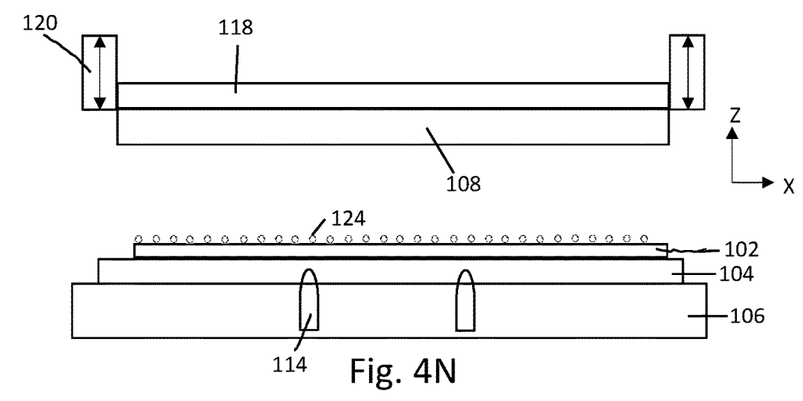
Figure 5A:
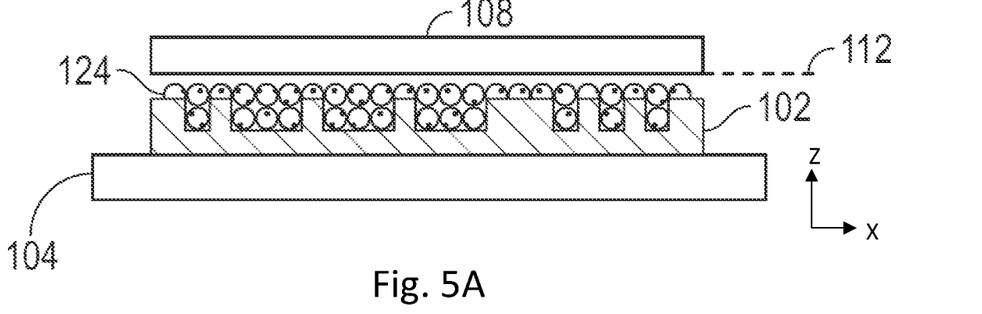
FIGS. 5A to 5C illustrate a schematic cross section of an example planarization process in accordance aspect of the present disclosure.

FIG. 3 shows a flow chart of a planarization method 300 in accordance with an example embodiment. FIGS. 4A to 4N show schematic cross sections specifically regarding step S302 and step S304 of the planarization method, i.e., dispensing at the dispensing station 103 and transferring to the planarizing station 105. FIGS. 5A to 5C show schematic cross sections specifically regarding step S306 to step S312, i.e., from contacting the formable material at the planarizing station 105 through separating the superstrate from the cured layer.

The planarization method 300 may begin with step S302, where formable material 124 is dispensed onto the substrate 102 in the form of droplets. The positioning system 110, 150 may be operated to pick up a substrate 102 from a substrate holder (not shown) using the hand 141 and to mount the substrate 102 on the substrate chuck 104 at the dispensing station 103. During this transfer, there is no need to cover the substrate 102 with the cover 160. Once the substrate 102 is mounted to the substrate chuck 104 at the dispensing station 103, the dispensing of the formable material 124 onto the substrate 102 may begin. As discussed above, the substrate 102 surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography.

FIG. 4A shows a schematic cross section of the substrate 102, on the substrate chuck 104, as the formable material 124 begins to be dispensed. As shown in FIG. 4A, drops of formable material 124 are being dispensed on the substrate 102. As also shown in FIG. 4A, the lift mechanism 114 is in a fully retracted position. Thus, the substrate 102 is mounted to the substrate chuck 104. FIG. 4B shows the same view at a moment after the dispensing of the formable material 124 has been completed. That is, FIG. 4B shows the moment after the completion of step S302. As shown in FIG. 4B, the dispenser 122 is no longer dispensing formable material and the substrate 102 has the formable material 124 deposited on top. Furthermore, the lift mechanism 114 remains in a fully retracted position such that the substrate 102 with formable material 124 is still mounted to the substrate chuck 104.

The planarization method 300 may then proceed to step S304 where the substrate 102 having the dispensed formable material 124 is transferred to the planarization station 105. As noted above, because the formable material 124 is volatile, it is desirable to prevent or minimize evaporation of the formable material 124 during the transfer from the dispensing station 103 to the planarizing station 105. The method of transfer that prevents or minimizes evaporation of the formable material is shows in FIGS. 4C to 4R.

Figure 4C:
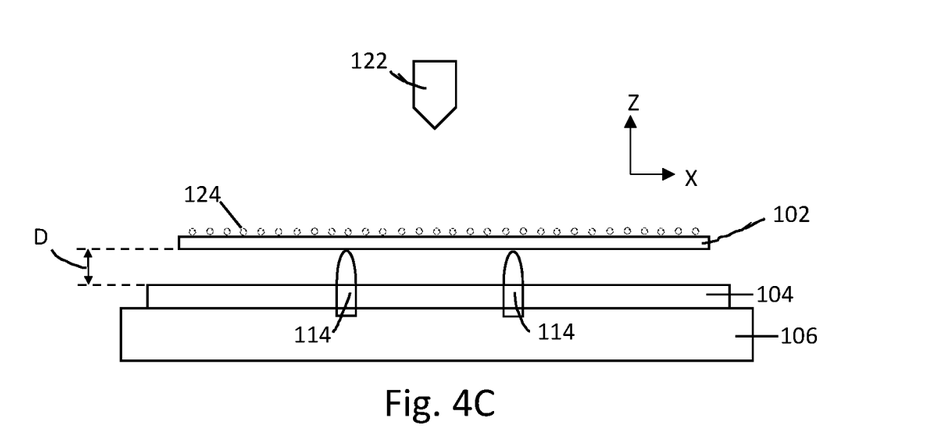

FIG. 4C shows a moment at the beginning of the transfer process. As shown in FIG. 4C, the lift mechanism 114 is actuated to first unmount the substrate 102 from the substrate chuck 104. In the illustrated example embodiment, the lift mechanism 114 is one or more pin lifts. The lift mechanism 114 raises upwardly in the Z direction thereby pushing the substrate 102 upwardly in the Z direction. FIG. 4C shows the moment when the lift mechanism 114 is in a fully extended position. In the fully extended position, the substrate is at a distance D from the upper end of the substrate chuck 104.

Figure 4D:
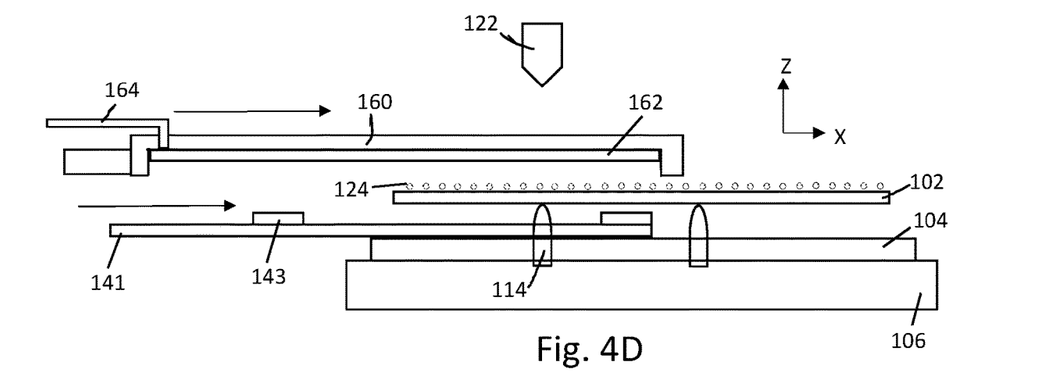

FIG. 4D shows a moment as the positioning system 110, 150 brings the hand 141 and the cover 160 into position below and above the substrate 102, respectively. As seen in FIG. 4D, the distance D is still being provided by holding the lift mechanism 114 in the extended position. The hand 141 is being moved within the space defined by distance D between the substrate 102 and the substrate chuck 104. The cover 160 is similarly being brought into position just above the substrate 102 using the positioning system 110, 150. In the case of the positioning system 110, because the cover 160 and the hand 141 are coupled with the same articulating arm 139, both are moved into position simultaneously. However, in the case of the positioning system 150, because the arm is coupled with the articulating arm 139 while the cover 160 is coupled with the articulating arm 152, the arm 141 and the cover 160 can be brought into position sequentially (in either order) or simultaneously. Therefore, while FIG. 4D shows the hand 141 and the cover 160 moving into their respective positions simultaneously, it is also possible for the hand 141 and the cover 160 to be moved sequentially.

Figure 4E:
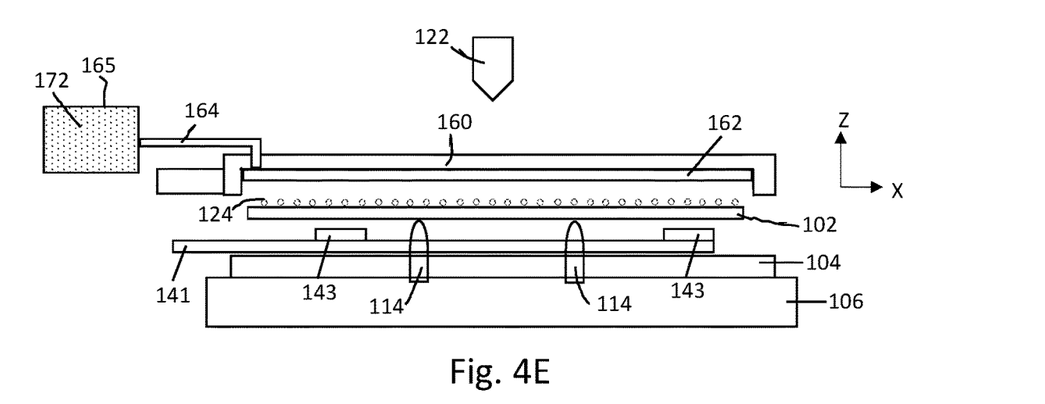

FIG. 4E shows a moment after the positioning system 110, 150 has completed moving the hand 141 and the cover 160 into the proper position at the dispensing station 103. As shown in FIG. 4E, the hand 141 is completely underneath the substrate 102 and is ready to receive the substrate support pads 143. At the same time the cover 160 is aligned above the superstrate 102 and dispensed formable material 124. However, the cover 160 has not yet been moved down to enclose the substrate 102 and formable material 124. In other words, in the moment shown in FIG. 4E, the cover 160 is properly positioned along the X and Y dimension, but is not yet at the final position in the Z dimension. As noted above, while the movement of the hand 141 and the cover 160 is shown as moving simultaneously in the illustrated embodiment, the movement may also be sequential.

Figure 4F:
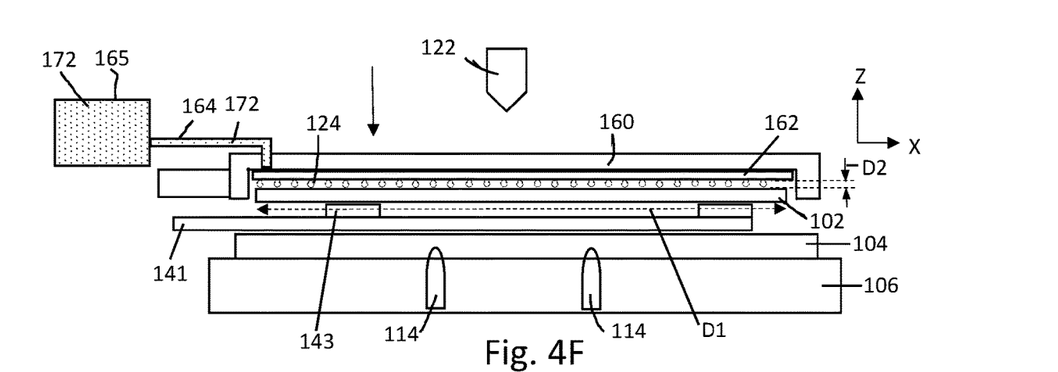

FIG. 4F shows a moment after the superstrate 102 has been lowered to mate with the hand 141 and the cover 160 has been lowered by positioning system 110, 150 such that the cover 160 encloses the substrate 102 and the formable material 124 (i.e., the substrate with formable material is inside the cover) with the underside of the substrate 102 facing the open bottom end 168 of the cover 160. As shown in FIG. 4F, the lift mechanism 114 has been lowered downwardly in the Z direction to the fully retracted position. The retracting of the lift mechanism 114 brings down the substrate 102 in the Z direction until an underside surface mates with the suction pads 143 of the hand 141. Once mated, a vacuum (not shown) may be applied to substrate 102 via the suction pads 143 to maintain the coupling between the hand 141 and the substrate 102. After coupling with the hand 141, the hand 141 is supporting the substrate 102. Similarly, the positioning system 110, 150 lowers the cover 160 downwardly in the Z direction until the inner volume of the cover 160 encompasses the substrate 102 and the formable material 124. More particularly, the cover 160 fully encompasses the formable material 124 and encompasses the top and sides of the substrate 102. The cover 160 need not encompass the underside surface of the substrate 102. The cover 160 may be sized relative to the substrate 102 such that in the position shown in FIG. 4F, a ratio of a diameter D1 of the substrate 102 to a distance D2 between the cover 160 and the substrate 102 (i.e., D1:D2) is 80:1 to 30:1. More specifically, the distance D2 may be from the upper surface of the substrate 102 and the inner surface of the top end 166. In another embodiment, the ratio D1:D2 may be 70:1 to 40:1 or 60:1 to 50:1. In an example embodiment, the diameter D1 may be 300 mm and the distance D2 may be 10 mm or less, more preferably 5 mm or less. The distance D2 may be 1 mm to 10 mm, 2 mm to 8 mm, 3 mm to 7 mm, or 4 mm to 6 mm.

In the case of the positioning system 110, because the arm 141 and the cover 160 are coupled to the same articulating arm 139, an additional lowering and lifting mechanism may be implemented to allow Z dimension movement of the cover 160 while the hand 141 remains stationary. For example, the lowering and lifting mechanism may include an actuator and two support shafts to allow for the relative Z dimension movement. In the case of the positioning system 150, because the hand 141 and the cover 160 are coupled to different articulating arms, the hand 141 may be kept stationary via the articulating arm 139 while the cover may be lowered via the articulating arm 152.

As noted above, in another embodiment the cover may have an enclosed bottom and an open side. In that case, instead of positioning the cover above the substrate and then lowering the cover, the cover may travel in the X dimension until the substrate enters into the cover via the open side such that the cover encloses the substrate (i.e., the substrate is inside the cover) with a portion of the substrate facing the open side of the cover.

After the cover 160 is located in the position to encompass the formable material 124, the fluid 172 from the fluid source 165 may be activated to flow through the supply line 164. The flowing of the fluid 172 from the fluid source 165 to the pad 162 via the supply line 164 is shown in FIG. 4F. Prior to the movement shown in FIG. 4F, the fluid 172 is not flowing through the supply line 164. The providing of the fluid 172 to the pad 162 after the cover 160 encompasses the formable material 124 and the substrate 102 creates an environment around the substrate 102 that prevents or minimizes evaporation of the formable material 124. In a first alternative embodiment, the pad 162 may need to be only occasionally charged with fluid 172 and sufficient fluid is supplied within the pores of the pad 162 to supply vapor to the volume between the substrate 102 and the cover 160. In a second alternative embodiment, there is no supply line 164 and the pad 162 is charged with fluid 172 by an operator. In a third alternative embodiment, the supply line 164 is intermittently connected to the pad 162 so that the pad can be charged with fluid 172 when necessary.

In an example embodiment, as noted above, the fluid 172 may be the same as the formable material 124. The evaporation of the formable material 124 is prevented or minimized by supplying the fluid 172 because the addition of the fluid 172 helps to saturate the vapor of the volatile components of the formable material 124 environment in the area surrounding the formable material 124. That is, when there is an open air environment surrounding the formable material 124, the formable material 124 will easily evaporate into the environment. However, when fluid 172 is provided to the pad 162, fluid 172 evaporates into the surrounding, approaching its saturation or equilibrium vapor pressure. Therefore, the formable material 124 on the substrate will not easily evaporate because the surrounding environment is already at or near the saturation or equilibrium vapor pressure due to fluid 172.

Figure 4G:
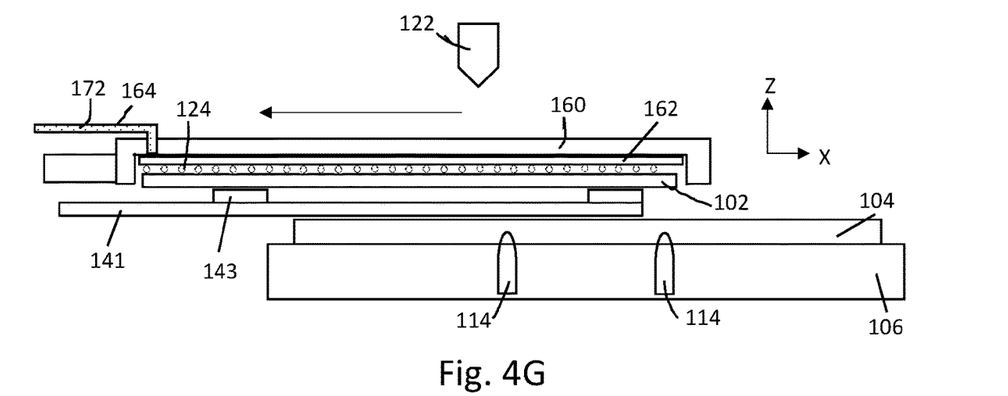

FIG. 4G shows a moment in the transferring process as the hand 141 (holding the substrate 102) and the cover 160 (covering the formable material 124 and the substrate 102) begin to be withdrawn from the dispensing station 103. As shown in FIG. 4G, the hand 141 remains coupled with the underside of the substrate 102, the cover 160 remains encompassing the formable material 124 and the substrate 102, and the fluid 172 continues to be supplied to the pad 162. The positioning system 110, 150 is controlled to move the hand 141 and the cover 160 simultaneously such that the cover 160 continues to encompass the formable material 124 and the substrate 102 while the substrate 102 is travelling. In the case of the positioning system 110 the simultaneous movement is achieved by actuating the second articulating arm 139. In the case of the positioning system 150, the simultaneous movement is achieved by coordinating the actuating of the second articulating arm 139 and the third articulating arm 152.

Figure 4H:
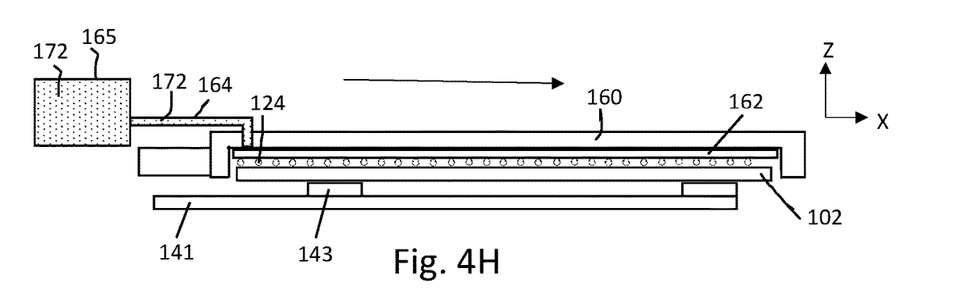

FIG. 4H shows a moment in the transferring process when the substrate 102, the hand 141, and the cover 160 have completely exited the dispensing station 103, but has not yet reached the planarizing station 105. The moment shown in FIG. 4H is essentially the same as in FIG. 4G, except for the location of the hand 141, substrate 102, and cover 160. That is, as shown in FIG. 4H, the hand 141 remains coupled with the underside of the substrate 102, the cover 160 continues to encompass the formable material 124 and the substrate 102, the pad 162 continues to supply vapor to the volume between the substrate 102 and the cover 160, and the fluid 172 may continue to be supplied to the pad 162.

Figure 4I:
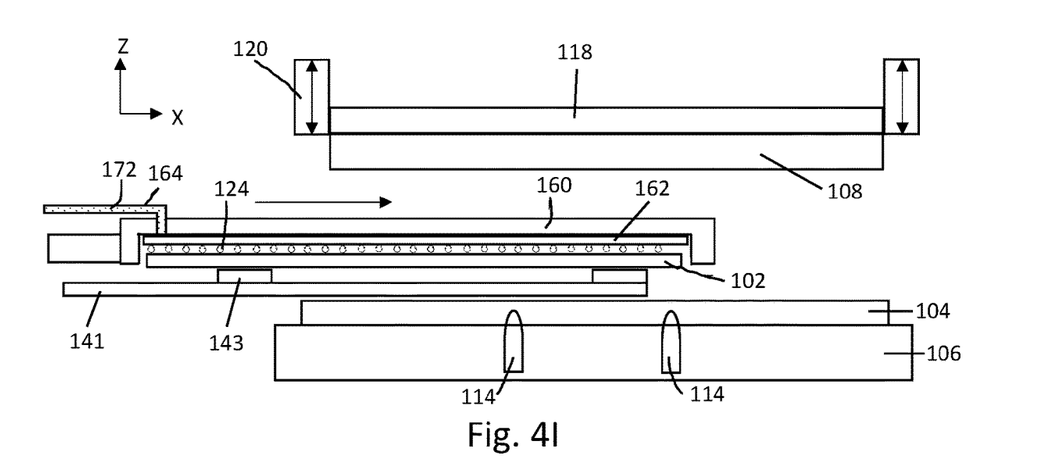

FIG. 4I shows a moment in the transferring process when the substrate 102, the hand 141, and the cover 160 are entering the planarizing station 105. More specifically, the substrate 102, the hand 141, and the cover 160 are entering the space between the planarization head 120 (holding the superstrate 108 via the superstrate chuck 118) and the substrate chuck 104. The moment shown in FIG. 4I is essentially the same as in FIG. 4H, except for the location of the hand 141, the substrate 102, and the cover 160. That is, as shown in FIG. 4I, the hand 141 remains coupled with the underside of the substrate 102, the cover 160 continues to encompass the formable material 124 and the substrate 102, the pad 162 continues to supply vapor to the volume between the substrate 102 and the cover 160, and the fluid 172 may continue to be supplied to the pad 162. The only difference being that the location of the substrate 102, the hand 141, and the cover 160 is at a point of entering the space between the planarization head 120 and the substrate chuck 104. As seen in FIG. 4I, as the substrate 102, the hand 141, and the cover 160 enter the space between the planarization head 120 and the substrate chuck 104, the lift mechanism 114 is the fully retracted position. The substrate 102, the hand 141, and the cover 160 continues to be moved via the positioning system 110, 150.

Figure 4J:
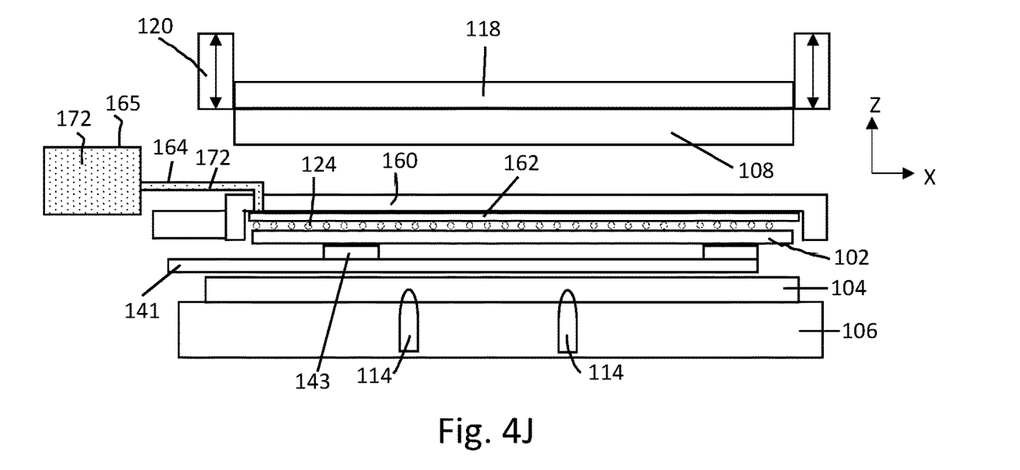

FIG. 4J shows a moment in the transferring process when the substrate 102, the hand 141, and the cover 160 have fully entered into the planarizing station 105. More specifically, the substrate 102, the hand 141, and the cover 160 are fully inserted into the space between the planarization head 120 (holding the superstrate 108 via the superstrate chuck 118) and the substrate chuck 104. The moment shown in FIG. 4J is essentially the same as in FIG. 4I, except for the location of the hand 141, the substrate 102, and the cover 160 has changed. That is, as shown in FIG. 4J, the hand 141 remains coupled with the underside of the substrate 102, the cover 160 continues to encompass the formable material 124 and the substrate 102, and the fluid 172 continues to be supplied to the pad 162. The only difference being that the location of the substrate 102, the hand 141, and the cover 160 is now fully within the space between the planarization head 120 and the substrate chuck 104. As seen in FIG. 4J, when the substrate 102, the hand 141, and the cover 160 fully enter the space between the planarization head 120 and the substrate chuck 104, the lift mechanism 114 is still in the fully retracted position. The substrate 102, the hand 141, and the cover 160 is moved to the fully inserted position via the positioning system 110, 150.

Figure 4K:
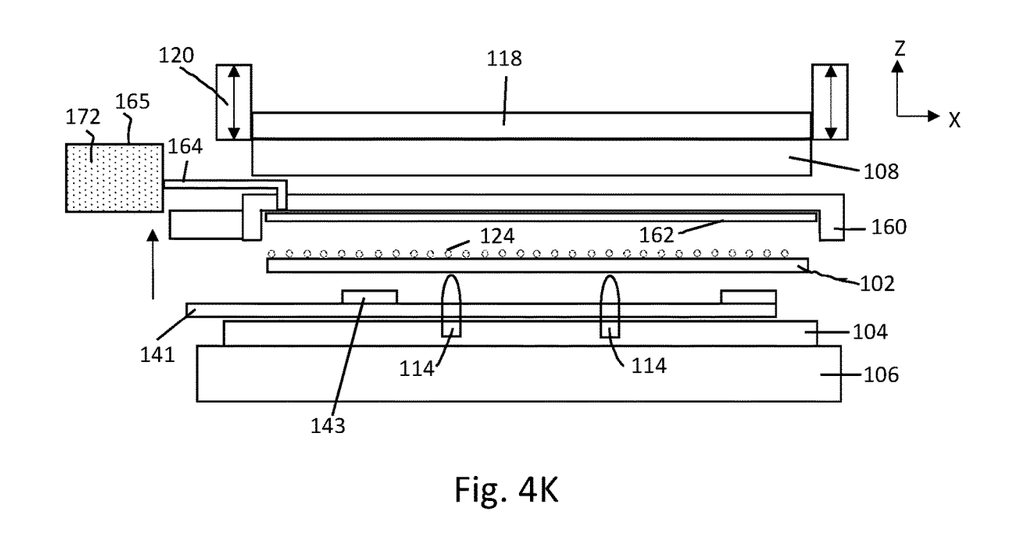

FIG. 4K shows a moment in the transferring process as the cover 160 and the hand 141 begin the process of being removed from the planarizing station 105. As shown in FIG. 4K, the lift mechanisms 114 have been extended to contact the underside of the substrate 102. At the same time, in a case that a vacuum is used to hold the substrate 102 to the hand 141 via the support pads 143, the vacuum may be terminated. Thus, the lift mechanism 114 lifts the substrate 102 off of the hand 141 upwardly in the Z dimension. Either simultaneously or before the lifting of the substrate 102 from the hand 141, the cover 160 may also be moved upwardly in the Z dimension. The cover 160 should be lifted at the same time or prior to the lifting of the substrate 102 so that that substrate 102 with formable material 124 does not come into contact with the cover 160. As also shown in FIG. 4K, the supply of the fluid 172 may have been terminated, i.e., there is no fluid 172 in the supply line 164. The fluid 172 is no longer needed at the time that cover 160 is being removed because there is no longer an enclosed environment once the cover removal process has begun.

As above, moving the cover 160 in the Z dimension is achieved via the positioning system 110, 150. Similar to the lowering process discussed above with respect to FIG. 4F, in the case of the positioning system 110, because the arm 141 and the cover 160 are coupled to the same articulating arm 139, the additional lowering and lifting mechanism may be implemented to allow Z dimension movement of the cover 160 while the hand 141 remains stationary. In the case of the positioning system 150, because the hand 141 and the cover 160 are coupled to different articulating arms, the hand 141 may be kept stationary via the articulating arm 139 while the cover may be raised via the articulating arm 152.

Figure 4L:
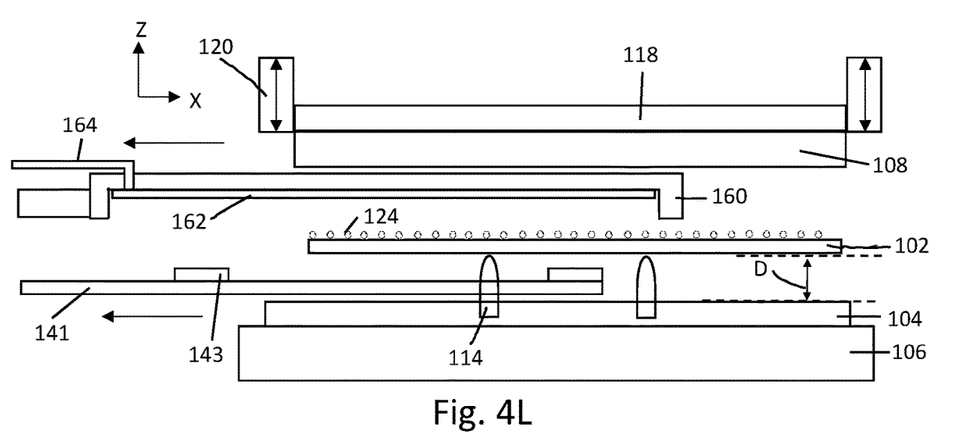

FIG. 4L shows a moment as the positioning system 110, 150 removes the hand 141 and the cover 160 from the planarizing station 105. As seen in FIG. 4L, the distance D is once again being provided by maintaining the lift mechanism 114 in the extended position. The hand 141 is being moved out of the space defined by distance D between the substrate 102 and the substrate chuck 104. The cover 160 is similarly being removed from the position just above the substrate 102 using the positioning system 110, 150. In the case of the positioning system 110, because the cover 160 and the hand 141 are coupled with the same articulating arm 139, both are removed simultaneously. However, in the case of the positioning system 150, because the hand 141 is coupled with the articulating arm 139 while the cover 160 is coupled with the articulating arm 152, the hand 141 and the cover 160 can be removed sequentially (in either order) or simultaneously. Therefore, while FIG. 4L shows the hand 141 and the cover 160 being removed simultaneously, it is also possible for the hand 141 and the cover 160 to be removed sequentially.

Figure 4M:
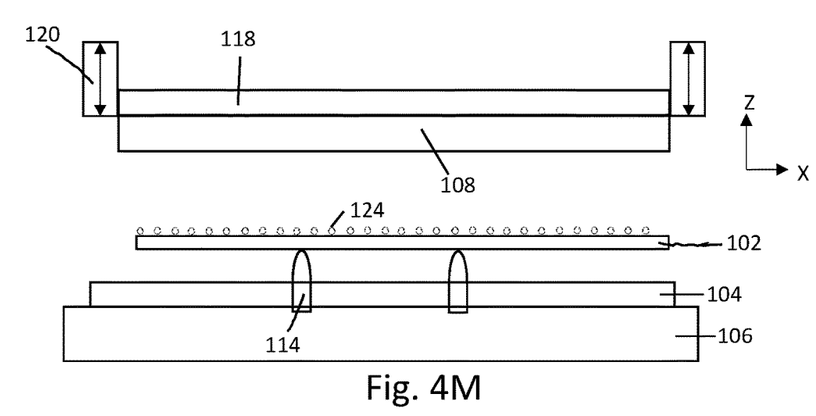

FIG. 4M shows the moment in the transferring process after the hand 141 and the cover 160 have been completely removed from the planarization station 105. As shown in FIG. 4M, at this moment the lift mechanism 114 is still fully extended such that the substrate 102 is not in coupled with the substrate chuck 104.

FIG. 4N shows the final moment in the transferring process. As shown in FIG. 4M, at this moment the lift mechanism 114 has been fully retracted such that the substrate 102 has been lowered and is now coupled with the substrate chuck 104. The formable material 124 on the surface of the substrate is now located beneath the planarization head 120. More specifically, the substrate 102 with the formable material 124 is located underneath the superstrate 108 being held by the superstrate chuck 118. Thus, the transfer of the substrate 102 with the formable material 124 from the dispensing station 103 to the planarizing station 105 is complete. As result of the implementation of the cover 160 evaporation of the formable material has been prevented or minimized during the transfer process.

After completion of the above-described process of transferring the substrate 102 with dispensed formable material 124 from the dispensing station 103 to the planarizing station 105, the planarization method 300 may then proceed to steps S306 and S308, where the substrate 102 having the formable material 124 is planarized using the planarizing station 105. FIG. 5A shows a schematic cross section at the planarizing station 105 at the moment just before the superstrate 108 comes into the contact with the formable material 124 on the substrate 102. The planarization head 120 may be moved toward the substrate 102 and apply a force to the superstrate 108 such that the superstrate 108 contacts (S306) and spreads (S308) droplets of the formable material 124.

Figure 5B:
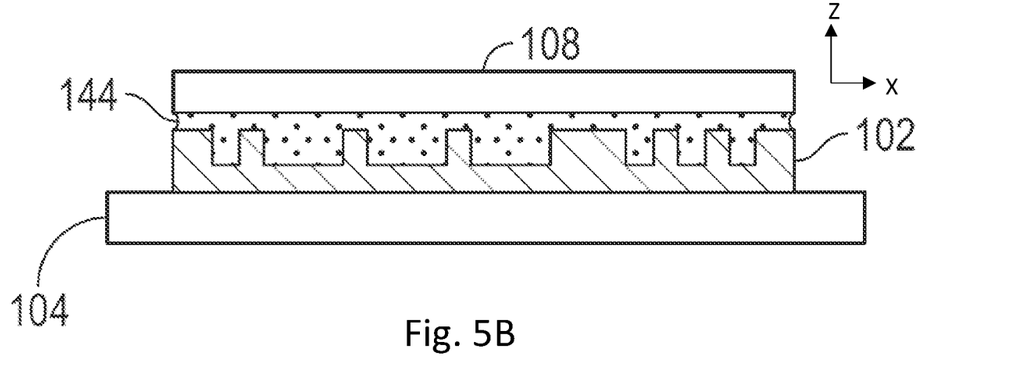
Figure 5C:
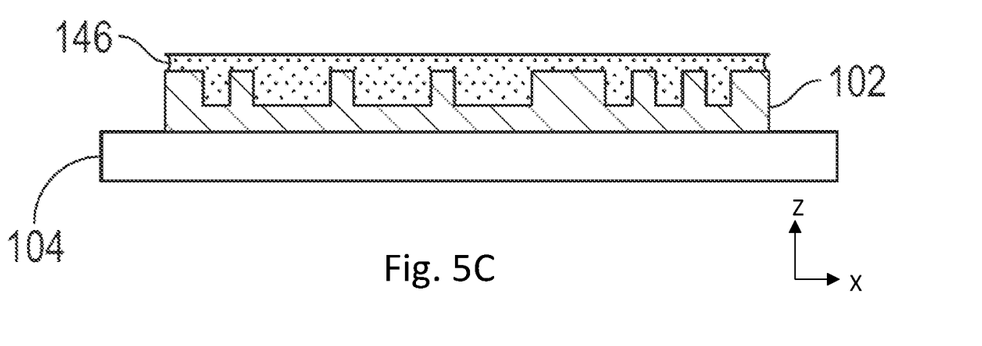

FIG. 5B illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. At the moment shown in the FIG. 5B, the steps S306 and S308 have been completed.

The method may then proceed to step S310, where the spread formable material is cured. The curing may occur at a separate curing station 107 as illustrated in FIG. 1 or may be cured at the same location as the planarizing station 105 in another embodiment. When the curing occurs at the curing station 107, the superstrate 108 is released from the superstrate chuck 118 while the superstrate 108 is still in contact with the formable material film 144. This action of releasing the superstrate 108 from the superstrate chuck 118 leaves the superstrate 108/the film 144/the substrate 102 free from the planarization head 120. The releasing of the superstrate 108 from the superstrate chuck 118 may also be referred to as dechucking. Thus, as a result of releasing the superstrate 108 from the superstrate chuck 118, the superstrate 108/the formable material film 144/the substrate 102 is moveable via the positioning system 110, 150 or the stage 106. After reaching the curing station 107, the formed film layer 144 is cured. The polymerization process or curing of the formable material 124 may be initiated with actinic radiation (e.g., UV light radiation). For example, radiation source 126 provides the actinic radiation causing formable material film 144 to cure, solidify, and/or cross-link, defining a cured layer 146 on the substrate 102. More particularly, as shown in FIG. 1, the UV light radiation is emitted from the array of LEDs 127 that are directed toward the film 144. Because the superstrate 108 is configured to be transparent with respect to the UV light radiation emitted from the array of LEDs 127, the UV light radiation passes through the superstrate 108 and acts upon the formable material film 144 to cure the formable material film 144 resulting in the cured layer 146. When the curing process is complete, the formable material film 144 has become a cured layer 146. In an embodiment where the curing occurs at the same location as the planarizing station 105, the light source may be provided above planarization head 120 and the light may be directed through the superstrate chuck 118 and the superstrate 108 to reach the film 144.

The planarization method 300 may then proceed to step S314, where the superstrate 108 is separated from the cured layer 146. In the case when the curing was performed at the separate curing station 107, the superstrate 108/the cured layer 146/the substrate 102 may be brought back to the planarizing station 105. To remove the superstrate 108 from the cured layer 146 the superstrate chuck 118 may be coupled once again to the superstrate 108 (i.e., rechucking the superstrate 108) via operation of the planarization head 120, while the superstrate 108 is still in contact with the cured layer 146. In the case that the curing occurs at the same location of the planarizing station 105, the superstrate 108 remains coupled with the superstrate chuck 118 and there is no rechucking step. Once the superstrate 108 is coupled with the superstrate chuck 118, the superstrate chuck 118 may begin to lift upwardly away from the substrate 102, via operation of the planarization head 120. Because the superstrate 108 is coupled with superstrate chuck 118, the lifting force will cause the superstrate 108 to separate from the cured layer 146. The separating force may be applied through several different methods. For example, the separating force may be applied by a pin pushing up on the superstrate 108, by a vacuum pulling up on the upper surface 141 of the superstrate 108, and/or by applying a high pressure jet of air at the intersection of the cured layer 146 and the superstrate 108.

FIG. 5C shows a schematic cross section of the substrate 102 after the superstrate 108 has been removed from the cured layer 146, i.e., after the completion of step S312. That is, FIG. 5C shows the completed cured planarized layer 146 on the substrate 102. The substrate 102 and the cured layer 146 may then be subjected to additional known steps and processes for device (article) fabrication, including, for example, patterning, curing, oxidation, layer formation, deposition, doping, planarization, etching, formable material removal, dicing, bonding, and packaging, and the like. The substrate 102 may be processed to produce a plurality of articles (devices). These additional steps may be performed by moving the substrate 102 having the exposed cured layer 146 to a distinct location. Once the substrate 102, having the exposed cured layer 146, is moved, the planarizing station 105 is ready to receive a new substrate with formable material and repeat the above process.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A shaping system comprising:
    a dispensing station including:
        a first substrate chuck configured to hold a substrate; and
        a dispenser configured to dispense formable material on the substrate while the first substrate chuck is holding the substrate;
    a shaping station including:
        a second substrate chuck configured to hold the substrate; and
        a plate chuck configured to hold a plate and configured to contact the dispensed formable material on the substrate with the plate while the plate chuck is holding the plate;
    a positioning system configured to move the substrate having the dispensed formable material from the dispensing system to the shaping station; and
    a cover having one or more walls,
    wherein, while the substrate having the dispensed formable material is moved by the positioning system from the dispensing station to the shaping station, the cover is positioned to enclose the substrate and the dispensed formable material such that a ratio of a diameter of the substrate to a distance between the cover and the substrate is 80:1 to 30:1.

2. The shaping system of claim 1, wherein the cover comprises an enclosed top end and an open bottom end.

3. The shaping system of claim 2, wherein the one or more sidewalls extends from the enclosed top end.

4. The shaping system of claim 2, wherein the positioning system is configured to enclose the substrate and the formable material with the cover at the dispensing station by lowering the cover until the substrate and formable material passes through the open bottom end.

5. The shaping system of claim 2, wherein positioning system is configured to uncover the substrate and the formable material at the shaping station by raising the cover until the substrate and formable material passes through the open bottom end.

6. The shaping system of claim 2, further comprising a porous pad disposed between the enclosed top end and the dispensed formable material while the cover encloses the substrate and the dispensed formable material.

7. The shaping system of claim 6, wherein the porous pad is disposed within the cover.

8. The shaping system of claim 6, wherein the porous pad comprises a material selected from the group consisting of stainless steel, titanium, nickel, a ceramic, polyether ether ketone, polyoxymethylene, polytetrafluoroethylene, and perfluoroalkoxy alkane.

9. The shaping system of claim 1, wherein the cover has a circular cross section.

10. The shaping system of claim 1, further comprising a supply line having one end in communication with a fluid supply and another end in communication with the cover.

11. The shaping system of claim 10, wherein the fluid supply contains liquid components of the formable material, wherein the formable material contains solid components and the liquid components.

12. The shaping system of claim 1, wherein the distance between the cover and the substrate is 10 mm or less.

13. The shaping system of claim 1, wherein the positioning of the cover to enclose the substrate and the dispensed formable material is performed by the positioning system.

14. The shaping system of claim 1, wherein the positioning system comprises a hand configured to carry the substrate.

15. The shaping system of claim 1, wherein the distance between the cover and the substrate is 5 mm or less.

16. The shaping system of claim 1, wherein the plate is a superstrate.

17. The shaping system of claim 1, wherein the shaping station is a planarizing station.

18. A shaping system comprising:
    a dispensing station including:
        a first substrate chuck configured to hold a substrate; and
        a dispenser configured to dispense formable material on the substrate while the first substrate chuck is holding the substrate;
    a shaping station including:
        a second substrate chuck configured to hold the substrate; and
        a plate chuck configured to hold a plate and configured to contact the dispensed formable material on the substrate with the plate while the plate chuck is holding the plate;
    a positioning system configured to move the substrate having the dispensed formable material from the dispensing system to the shaping station;
    a cover positioned to enclose the substrate and the dispensed formable material while the substrate having the dispensed formable material is being moved by the positioning system from the dispensing system to the shaping station; and
    a porous pad disposed inside the cover while the cover encloses the substrate and the dispensed formable material.

19. A shaping method, comprising:
dispensing formable material on a substrate at a first location while the substrate is held by a first substrate chuck;
moving the substrate having the dispensed formable material from the first location to a second location; and
while a plate is held by a plate chuck and while the substrate is held by a second substrate chuck at the second location, contacting the dispensed formable material on the substrate with the plate to form a film layer,
wherein, while the substrate having the dispensed formable material is moved from the first location to the second location, a cover having one or more walls is positioned to enclose the substrate and the dispensed formable material such that a ratio of a diameter of the substrate to a distance between the cover and the substrate is 80:1 to 30:1.

20. A method of manufacturing an article, comprising:
dispensing formable material on a substrate at a first location while the substrate is held by a first substrate chuck;
moving the substrate having the dispensed formable material from the first location to a second location;
while a plate is held by a plate chuck and while the substrate is held by a second substrate chuck at the second location, contacting the dispensed formable material on the substrate with a plate at the second location to form a film layer;
curing the film layer to form a cured film layer; and
processing the cured film layer to make the article,
wherein, while the substrate having the dispensed formable material is moved from the first location to the second location, a cover having one or more walls is positioned to enclose the substrate and the dispensed formable material such that a ratio of a diameter of the substrate to a distance between the cover and the substrate is 80:1 to 30:1.

21. The shaping system of claim 1, wherein the positioning system is configured to move the substrate having the dispensed formable material from the dispensing system to the shaping station while the plate is held by the plate chuck at the shaping station.

22. The shaping system of claim 1,
wherein the positioning system is configured to remove the cover from enclosing the formable material at the shaping station, and
wherein the shaping station is configured to contact the dispensed formable material on the substrate with the plate after the positioning system has removed the cover from enclosing the formable material at the shaping station.

23. The shaping system of claim 1,
wherein the positioning system includes a hand and an arm, and
wherein the hand and the cover are couple to the arm.

24. The shaping system of claim 1,
wherein the dispensing system includes a lifting mechanism configured to lift the substrate from the first substrate chuck after the dispenser dispenses the formable material on the substrate.

* * * * *